United States Patent [19]

Junod et al.

[11] 4,259,744
[45] Mar. 31, 1981

[54] SIGNAL GENERATOR

[75] Inventors: Michael T. Junod; Albert M. Bates, both of Southampton, Pa.

[73] Assignee: The United States of America as represented by the Secretary of the Navy, Washington, D.C.

[21] Appl. No.: 70,204

[22] Filed: Aug. 27, 1979

[51] Int. Cl.³ .................... H04B 1/04; H03L 7/08; H03C 3/02
[52] U.S. Cl. .................................... 455/103; 331/2; 331/14; 332/21; 455/113; 455/119
[58] Field of Search ............... 331/2, 14; 455/103, 455/110, 113, 119, 125; 370/69, 77; 332/21

[56] References Cited

U.S. PATENT DOCUMENTS

| | | | |
|---|---|---|---|
| 2,614,246 | 10/1952 | Dome | 455/103 |
| 3,277,389 | 10/1966 | Venn | 331/2 |
| 3,370,266 | 2/1968 | Taddeo et al. | 331/2 |
| 3,465,103 | 9/1969 | Lynch | 455/110 |
| 3,479,610 | 11/1969 | Wicker | 331/14 |
| 3,713,040 | 1/1973 | Page, Jr. | 331/1 A |
| 3,899,746 | 8/1975 | Gammel | 331/14 |
| 3,927,384 | 12/1975 | Jezo | 331/2 |

Primary Examiner—Marc E. Bookbinder
Attorney, Agent, or Firm—R. S. Sciascia; Henry Hansen

[57] ABSTRACT

A simultaneous multichannel signal generator incorporating phase-locked loop frequency correction. For each channel, there is a voltage-controlled oscillator (VCO) set to an appropriate frequency by a tuning signal and modulated by a channel data signal. The output signals from all VCO's are provided to a summer and then are appropriately amplified and filtered for transmission. A single multiplexed frequency correction circuit compares the phase of a reference frequency signal with the phase of a VCO output signal whose frequency has been divided, by a divide-by-N counter, to the reference frequency. If the divided VCO signal is out of phase with the reference frequency signal, an appropriate correction signal is provided to the device providing voltage control for that VCO.

1 Claim, 4 Drawing Figures

SIGNAL GENERATOR

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to signal generators, and more particularly to generators of a plurality of signals with correction therefor.

In the field of radio-frequency communications or transmission of information, it has been a general practice to employ serial radio-frequency transmission to perform serial transmission of information to a remote receiver. Although such devices have served the purpose, they have not proven entirely satisfactory under all conditions of service because difficulty has been experienced in increasing data transmission rates with limited bandwidth available, a problem which is overcome by the present invention.

Serial radio-frequency transmission of information, wherein a single stream of bits is used to modulate a transmitter has limited capability. If more information must be transmitted within a fixed period of time, the data rate must be increased, which has several undesirable consequences. For example, higher data rates place more severe constraints on the components used to modulate the transmitter, which can result in higher cost. Furthermore, an increased data rate requires a higher receiver bandwidth, so that serial transmission is limited by the receiver's maximum bandwidth, a limitation which can be troublesome in the event of increased data requirements. A partially parallel digital radio-frequency uplink can provide increased data rates with savings in receiver bandwidth and in the modulation components of the transmitter. However, such implementation of multiple carriers would entail building several complete transmitters, each for example including a crystal oscillator and several tuned multiplication and amplification stages needed to produce the desired output power and frequency. Such an approach would use a large number of parts and waste valuable space, which can be especially disadvantageous where available space for the transmitter is limited. Also, accompanying each additional transmitter are additional required adjustments, resulting in cumbersomeness and inefficiencies.

SUMMARY OF THE INVENTION

Accordingly, it is a general purpose of the present invention to provide a signal generator capable of simultaneous production of a plurality of signals, each of independent frequency.

Other objects of the present invention are to provide a simultaneous multichannel transmitter which is capable of tuning to more than one frequency simultaneously to effectively utilize a new frequency band allocation with a minimum impact on increasing device stores, capable of transmission of information on more than one frequency, while meeting the performance characteristics required by the communications link, having reduced transmitter bandwidth requirements for a given overall data rate, capable of utilizing older low bandwidth receivers with new higher data rate systems, having multiple function capability such as multiple beams, having improved reliability, capable of longer range data-link differential transmission, and having increased flexibility in digital data transmission by allowing a partially parallel format.

Further objects of the present invention are to provide a simultaneous multichannel transmitter which is capable of reducing the required data rate, provides parallel transmission of multiple beams, eliminates the need for multiple transmitters to effect a simultaneous multi-channel or multi-carrier scheme for transmitter realization and requires minimal additional circuitry therefor, capable of simultaneous operation at a plurality of carrier frequencies, requires little additional space compared with a single carrier multi-channel transmitter, provides separate uniquely digitally modulated radio-frequency carriers at the same time, reduces necessary receiver bandwidth, and increases reliability of transmitted information.

Briefly, these and other objects of the present invention are accomplished by a simultaneous multi-channel, multi-carrier transmitter system including a plurality of voltage-controlled oscillators (VCOs) each receiving a corresponding modulation signal therefor and an independent tuning signal therefor. Each VCO output signal is provided to a summer whose output signal is appropriately processed as necessary for transmission to a distant receiver. Each VCO output signal is also provided to a multiplexer, frequency correction circuit and demultiplexer in series for multiplexed frequency correction of each of the VCOs in sequence and provision of a corresponding tuning voltage signal to each VCO as corrected. The demultiplexer is connected to provide an appropriate tuning voltage input signal to each oscillator. Any number of voltage-controlled oscillators or other signal generators capable of being corrected by a correction signal can be utilized.

Other objects, advantages and novel features of the invention will become apparent from the following detailed description of the invention when considered in conjunction with the accompanying drawings wherein:

DESCRIPTION OF THE PREFERRED EMBODIMENT

Figure 1:
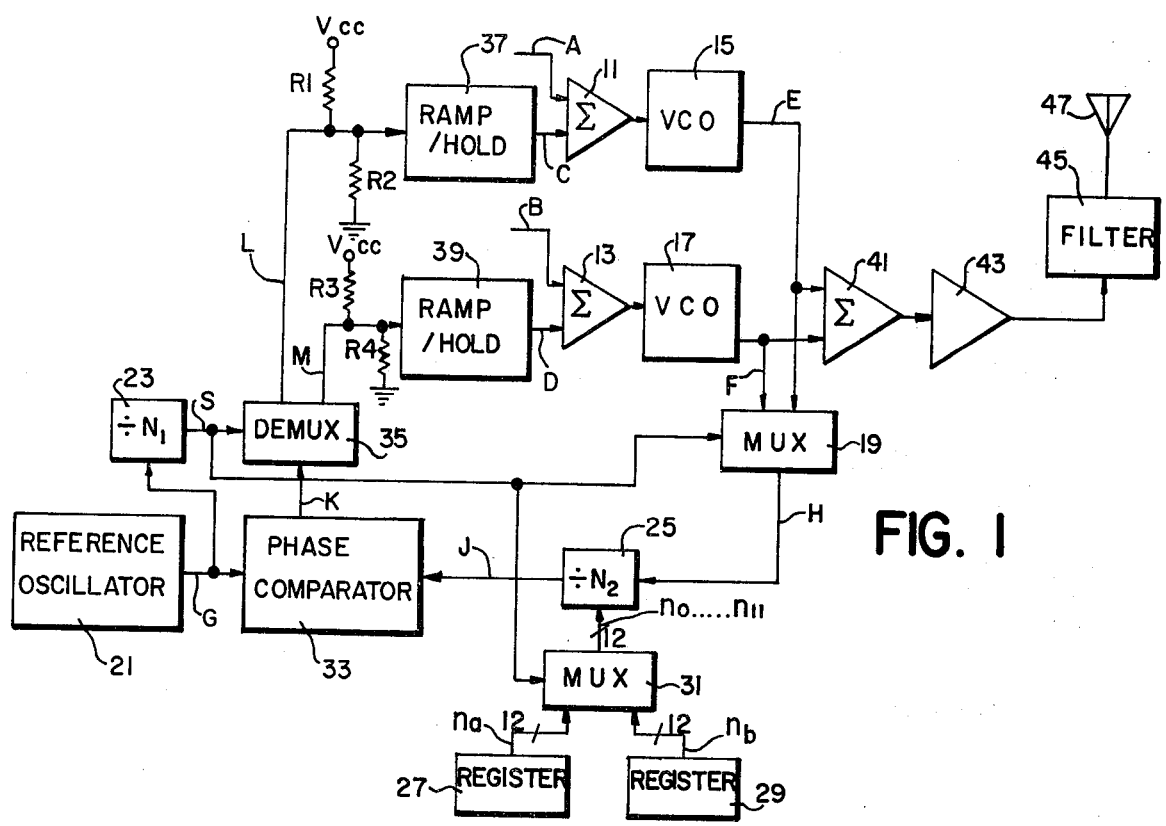
FIG. 1 is a block diagram of a multichannel transmitter according to the present invention.

Referring now to the drawings, wherein like reference characters designate like or corresponding parts or signals throughout the several views, there is shown in FIG. 1 a multichannel transmitter capable of providing several separate uniquely digitally modulated radio-frequency carriers at the same time, and including summers 11 and 13 receiving an external modulation signal A or B respectively, and a tuning voltage signal C or D respectively. The output of summer 11 or 13, respectively, is coupled to the control signal input of voltage-controlled oscillator (VCO) 15 or 17, respectively. Summer 11 provides a control signal, which is indicative of the sum of signals A and C, to control the frequency of the signal E produced by voltage-controlled oscillator 15, and summer 13 provides a signal which is indicative of the sum of signals B and D to control the frequency of the signal F produced by voltage-controlled oscillator 17. Respective information-bearing modulation signals A and B modulate the frequency of the signal E produced by voltage-controlled oscillator 15 or of signal F produced by voltage-controlled oscillator 17, respectively, so that the two VCOs 15 and 17 each produce a frequency modulated output signal E or F respectively indicative of input signals A and B. Signals C and D determine the radio-frequency center frequencies or output channel frequencies of the system of FIG. 1. Direct current control voltage signals C and D, which are produced in the manner described below, determine the operating signal frequency (or channel frequency or carrier frequency) of respective signals E and F produced by VCOs 15 and 17 respectively. Signals E and F produced by VCOs 15 and 17 respectively are provided to the inputs of and combined by summer 41 which produces a signal indicative of the sum of signals E and F. The output signal produced by summer 41 is amplified by broadband radio-frequency gain amplifier 43 and thence to bandpass filter 45 and broadband antenna 47 for transmission to a remote receiver. Bandpass filter 45 removes spurious signals resulting from frequency addition and subtraction of various carrier signals and information-bearing carrier signals. The desired output channel frequencies can be chosen such that any mixing sums or differences that could result in the amplification and transmission process would not fall inside the desired frequency band. Thus, antenna 47 provides two information-bearing frequency-modulated (FM) signals of different channel frequency to a remote receiver, although more than two such signals could be so provided if additional VCOs and other appropriate signal processing hardware were provided in the system of FIG. 1.

Figure 2:
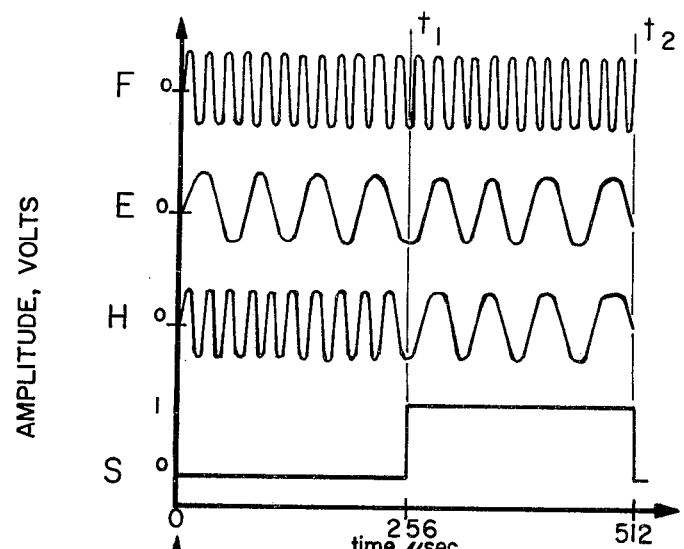
FIG. 2 is a waveform timing chart describing signals generated by the system of FIG. 1.
Figure 3:
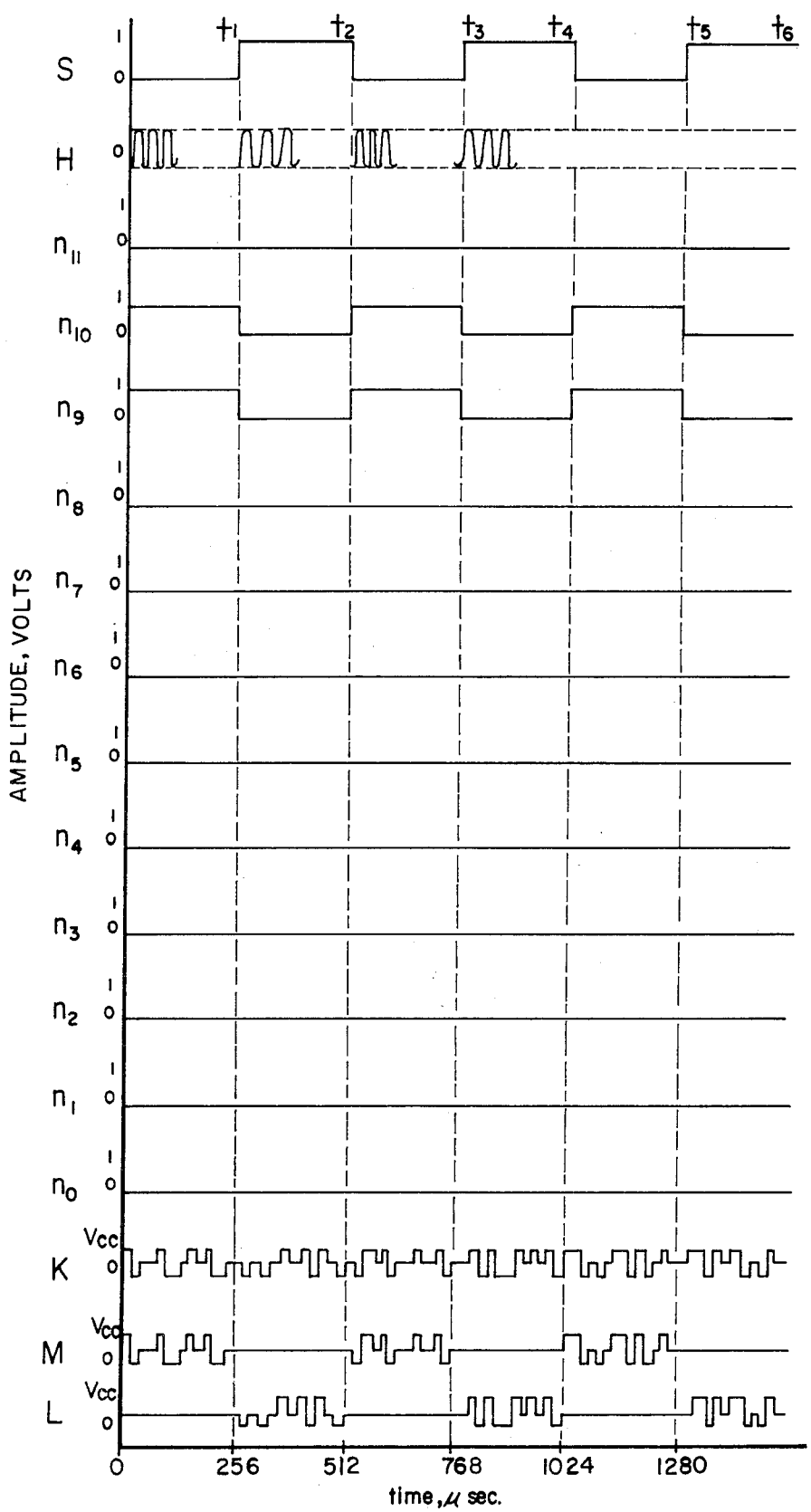
FIG. 3 is another waveform timing chart describing signals generated by the system of FIG. 1.

Signals E and F are also provided to multiplexer 19, which can for this example be a two-way multiplexer which is controlled by select signal or multiplexing signal S. Reference oscillator 21 produces a reference frequency signal G which is provided to divide-by-N counter 23. Divide-by-N counter 23 divides and so reduces the frequency of signal G by a predetermined amount to produce the multiplexing signal S which is received by and controls the operation of multiplexers 19 and 31 and of demultiplexer 35. The divisor of divide-by-N counter 23 is preset to be the ratio between the frequency of the reference oscillator and the desired rate of multiplexing or signal selection. FIG. 2 shows a fragment for one period of signal S, for example between 0 and 512 microseconds, of some of the signals appearing in FIG. 3 together with other associated signals. As is shown in exaggerated form in FIGS. 2 and 3, multiplexer 19 multiplexes the received RF signals E and F received from VCOs 15 and 17 respectively, and provides only one of the signals E or F at any one time as signal H to divide-by-N counter or counter chain or variable divider 25. Thus, signal H represents the multiplexed combination, determined by select signal S, of the individual VCO signals received by multiplexer 19. Examples of signals E, F and H are shown in FIGS. 2 and 3 for simplicity as modulated by corresponding modulating signals of constant unitary value. The divisors for divide-by-N counter 25 are stored in and provided by a plurality of registers such as registers 27 and 29 whose respective outputs (signals $n_a$ and $n_b$, respectively) are provided to, received by and multiplexed by multiplexer 31. Multiplexer 31 also receives and is controlled by select signal S which determines which register signal $n_a$ or $n_b$ is to be provided by multiplexer 31 to divide-by-N counter 25 as the divisor, $n_{11} \ldots n_0$ therefor. Multiplexer 19 provides signal H to divide-by-N counter 25, which divides signal H by an integral divisor to reduce the frequency of signal H, and thereby produces signal J whose frequency is the same as or close to that of reference frequency signal G. The value of this divisor is selected so that if the central operating frequency or carrier frequency of the VCO 15 or 17 output signal E or F being checked is at its desired value, then the frequency of divided signal J will be equal to that of reference frequency signal G. Any deviation from the desired signal E or F frequency value causes a lead or lag of a signal J leading edge with respect to a time-associated, contemporaneous or corresponding signal G leading edge, resulting in a phase difference between signal J and signal G which can be sensed by phase comparator 33. The desired output frequency value can thus be preset by appropriately presetting the value of the divisor and the frequency of signal G so that their product equals the desired frequency value. Accordingly, the appropriate value of the divisor for divide-by-N counter 25 depends on the intended frequency of the signal H being divided, which frequency is selected by multiplexing signal S. Thus, signal S is also provided to multiplexer 31 to determine which register's divisor value is to be provided to divide-by-N counter 25. It should be understood that the respective divisors for divide-by-N counter 23 and for divide-by-N counter 25 are not necessarily equal. Signals $n_a$ and $n_b$ can be respectively provided by register 27 and register 29 to multiplexer 31 each in parallel format via a 12-bit bus, and divisor signal $n_{11} \ldots n_0$ can be provided from multiplexer 31 to counter 25 in parallel format via a 12-bit bus, one bit for each transmitted bit of the divisor signal being provided.

Figure 4:
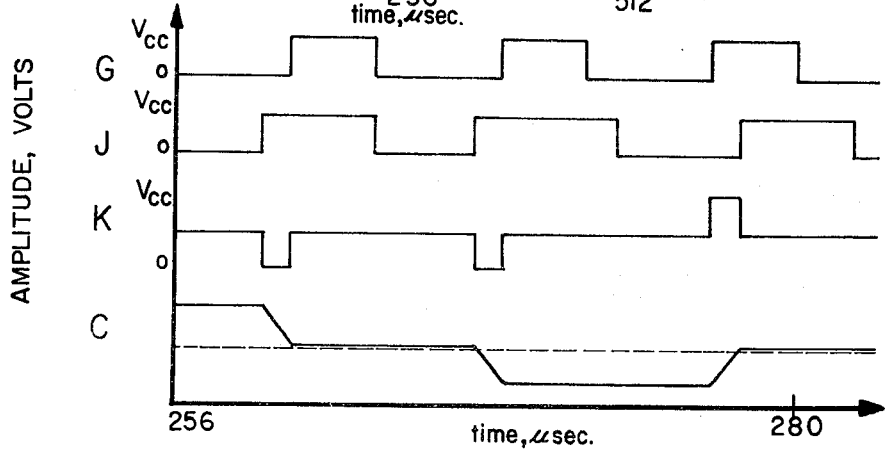
FIG. 4 is another waveform timing chart describing signals generated by the system of FIG. 1.

Signal J produced by counter 25 and reference frequency signal G produced by reference oscillator 21 are received and compared by phase comparator 33. Phase comparator 33 compares the phases of the received signals G and J, and produces a direct current signal K indicative of any phase difference therebetween. One device which can be utilized as phase comparator 33 is available on an RCA CD4046A device. Any phase difference between signals G and J indicates that the frequency of signal J is different from the frequency of signal G, and thus indicates that the actual central operating frequency of the VCO 15 or 17 whose output signal E or F has been multiplexed, divided and compared with reference signal G is different from the desired central operating frequency determined by the frequency of reference signal G and the value of the divisor of counter 25. The state of signal K indicates whether the phase of comparison signal J is the same as, leads or lags the phase of reference signal G. FIG. 3 includes a coarse representation of signal K to show its nature and the demultiplexing of signal K to produce signals L and M. FIG. 4 illustrates in more precise detail a 24-microsecond fragment of signal K taken between T=256 microseconds and T=280 microseconds, showing the actual pulses occurring during this time, with other associated signals. As is shown in FIG. 4, signal K normally has a neutral amplitude of $(V_{cc}-V_{ss})/2=V_{cc}/2$, but drops to a "low" value of $V_{ss}=0$ when the leading edge of a signal J waveform precedes the leading edge of a time-associated signal G waveform and remains at zero amplitude until the comparator 33 encounters that signal G leading edge, when the signal K amplitude returns to $V_{cc}/2$. Also, the amplitude of signal K is increased to a "high" value of $V_{cc}$ when a leading edge of signal G precedes a time-associated leading edge of signal J, and remains at the higher amplitude until comparator 33 senses the corresponding leading edge of signal J, at which time the amplitude of signal K returns to $V_{cc}/2$. For time-associated signal G and signal J leading edges which are simultaneous the amplitude of signal K remains at $V_{cc}/2$. Bias resistors R1 and R3 each connected to the voltage source of collector supply voltage $V_{cc}$, and bias resistors R2 and R4 each connected to ground, collectively maintain the "neutral" state of respective signals L and M at an amplitude of $V_{cc}/2$. Signal K produced by comparator 33 is provided to, received by and demultiplexed by demultiplexer 35, as is shown in FIG. 3. Since select signal S determines which VCO 15 or 17 output signal E or F is to be multiplexed, divided and compared with reference frequency signal G, signal S is also provided to control demultiplexer 35 to determine whether signal K is to be provided to ramp/hold device 37 as signal L or to ramp/hold device 39 as signal M. Demultiplexer 35 acts as a tristate device, having on its output lines a high-impedance "open" state for the ramp/hold device(s) not selected by signal S for provision thereto of signal K during any one time. While a ramp/hold device receives such an "open" signal, the bids resistors R1 and R2 or R3 and R4 connected to the input line thereof maintains the amplitude of the input signal to that ramp/hold device at the "neutral" value of $(V_{cc}-V_{ss})/2$. Signal L is provided to ramp/hold device 37 which produces a slowly varying direct current signal C which increases or decreases with a constant slope while signal L is in the "high" or "low" state, respectively, and remains constant at all other times, as is shown in FIG. 4. Such a ramp and hold function can be realized with an integrator operational-amplifier circuit, and an auxiliary operational amplifier providing an offset input to the integrator to prevent drifting of the integrator output voltage when the input to the integrator is neutral. The integrator input is biased via the bias resistors such that an input signal of $V_{cc}$ volts produces a positive slope ramp, while an input signal of zero volts (ground) produces a ramp of negative slope. An input signal of $V_{cc}/2$ causes no change in the output voltage. The integrator produces a ramp output from a step input, while the auxiliary amplifier effects "hold". For further information see *Linear Integrated Circuits*, National Semiconductor Corp. Santa Clara, February 1975, p. 2-253. Signal C produced by ramp/hold device 37 is provided to summer 11 and thence to VCO 15 as a correction signal therefor. Ramp/hold device 39 similarly receives and processes signal M from demultiplexer 35 to produce a similarly but independently slowly varying direct current signal D which is provided to summer 13 and therefrom to VCO 17 as a correction signal therefor. The respective amplitudes of signals C and D remain constant until changed by appropriate changes in signals L and M respectively, and adjust the central operating frequency of VCO 15 or 17, respectively, to be at their respective predetermined values.

Thus, the system of FIG. 1 includes two multiplexed phase-locked loops, multiplexed by multiplexer 19, multiplexer 31 and demultiplexer 35, which are controlled by counter 23 producing signal S. Ramp/hold device 37, summer 11, VCO 15, counter 25, oscillator 21 and phase comparator 33 comprise one-phase-locked loop. Ramp/hold device 39, summer 13, VCO 17, counter 25, oscillator 21 and comparator 33 together comprise another phase-locked loop.

The integration time constant of ramp and hold circuits 37 and 39 (which can for example be 1/200 Hz=5 msec.) is preferably an order of magnitude greater than the respective periods of modulation signals A and B, so that the effect of the modulation signals on the phase-locked loops is averaged or integrated out. Since the time average of the modulation provided by signals A and B is generally the middle, neutral value of $V_{cc}/2$, the modulation has no long-term deviation effect on the carrier frequencies effected by the phase-locked loops. In contradistinction, the correction process accomplished by the present phase-locked loop generally maintains the sense of the control pulses until the desired frequency correction is obtained.

The auxiliary holding portion of the ramp and hold circuit maintains the produced VCO control voltage indefinitely while deselected by signal S. Accordingly, the only considerations in choosing a selection rate (frequency of signals) is the amount of short term carrier frequency error which can be tolerated, and interference of the selection signal S with the modulation signals A and B.

For the embodiment shown in FIG. 1, the intended central operating frequency of VCO 15, and signal E can for example be 125 MHz, and the predetermined central operating frequency of VCO 17 and of signal F can for example be 200 MHz. Reference signal G produced by reference oscillator 21 can for example have a frequency of 125 kilohertz. The divisor for divide-by-N counter 23 can for example be preset to a value of 64, so that select signal S then has a frequency of 1.95 KHz and a period of 512 microseconds. The multiplexing rate set by signal S should preferably be such as not to interfere with modulation of the carrier signals, so that correction of the output signals' respective carrier frequencies is accomplished at a rate below the modulation frequency or frequencies. Signals E and F can for example be VHF sine waves having frequencies of 125 MHz and 200 MHz, respectively, and the respective counter 25 divisors therefor can then for example be 125 MHz÷125 KHz=$1000_{10}$ and 200 MHz÷125 KHz=$1600_{10}$, each of which can be presented in parallel binary coded decimal (BCD) format. $1600_{10}$ is equivalent to 1011000000000 in binary coded decimal notation and $1000_{10}$ is equivalent to 1000000000000 in binary coded decimal notation, so that thirteen parallel binary input lines are required for either of these numbers. Since the most significant binary coded decimal digit of the divisor for counter 25 is then always one, this digit can be so hard-wired, with the remaining twelve bits being provided by registers 27 and 29 via twelve-bit buses to multiplexer 31 and thence via another twelve-bit bus to counter 25. Alternatively, most significant bis $n_{12}$ can be provided by the registers. Provision of signal E or signal F from multiplexer 19 to counter 25 as signal H can depend upon whether select signal S is high or low. The 12 divisor bits $n_{11}$ . . . $n_0$ provided by multiplexer 31 to counter 25 would then vary with time as is shown in FIG. 3. Voltage $V_{cc}$ can for example be 12 volts. Voltage $V_{ss}$ can for example be zero volts or ground. The peak-to-peak voltage for signals E, F and H can for example be 1½ volts. The broken line shown with the waveform of FIG. 4 for signal C represents the signal amplitude where no correction of the associated VCO frequency is necessary. Initially, at startup, signal C should be held at for example 2 volts by ramp/hold device 37 and signal D set at 10 volts by ramp/hold device 39, to effect initial central or carrier frequencies of 125 MHz and 200 MHz for VCOs 15 and 17 respectively (0.1067 volts per MHz). The variation of signal C of FIG. 4 from the nominal broken line during normal operation can for example be on the order of ±10 microvolts, for example +10 microvolts at T=256 microseconds. The respective resistances of resistors R1, R2, R3 and R4 can for example all be equal to 100 K ohms.

In summary, operation of the foregoing embodiment of the present invention is as follows. A selecting signal S multiplexes VCO's 15 and 17 into divide-by-N counter 25. The corresponding divisor for counter 25 is selected by multiplexer 31 for the counter. The output J of counter 25 is fed into a phase comparator 33 which also receives the reference frequency signal G produced by reference oscillator 21. Any resulting correction pulses from phase comparator 33 are switched by demultiplexer 35 to the appropriate ramp/hold device 37 or 39. Ramp/hold devices 37 and 39 are each capable of holding their respective output signals C or D constant while no such correction pulses are received so that the control voltage provided therefrom to the corresponding VCO 15 or 17 is maintained while some other ramp/hold device is receiving pulses from phase comparator 33.

If the modulation data rate of a single channel transmitter is the number X, then, since there are two available carriers provided by the system of FIG. 1, the resultant data rate modulating each carrier is X/2. In general, if P equals the number of available carriers, then the modulation data rate of each carrier would then be X/P. This lower rate would allow utilization of a lower bandwidth receiver to receive signals from the system of FIG. 1, thus extending the usefulness of receivers that would otherwise be incompatible with the system.

The present invention includes a plurality of voltage controlled oscillators multiplexed through a common frequency correction loop to realize multiple radio frequency output with unique modulation. A voltage controlled oscillator does not need constant correction. Instead, each VCO is corrected sequentially in the present invention. The outputs of the VCOs are summed and amplified in one broadband amplifier 43. Each VCO output is also sequentially connected to the frequency correction circuit which generates an output consistent with the frequency status of that particular VCO. This output is fed to the ramp/hold device or other device which controls the selected VCO. The controls to the frequency correction circuits are likewise selected to control each VCO to its intended frequency. Therefore, only one RF amplifier and one frequency correction network are needed for a plurality of channels. Each additional channel requires only another ramp/hold device and VCO. Each VCO has its own modulation input, which allows each channel to convey unique information.

As an alternative, the voltage controlled oscillators of FIG. 1 can be multiplexed to a different frequency correction circuit than a phase-locked loop. For example, an automatic frequency control (AFC) circuit, or a frequency correction loop with a counting window, can be utilized in the system of FIG. 1 in lieu of counter 25, registers 27 and 29, multiplexer 31 and phase comparator 33; in this situation, reference oscillator 21 would only be needed for production of multiplexing signal S. An AFC loop counts the number of signal cycles to measure frequency error in the signal. In an AFC system, control amplifiers can be used in place of the loop filters. If voltage controlled oscillators are utilized which have two input ports, one for the modulation signal and one for the tuning or control voltage, then summers 11 and 13 can be dispensed with and the appropriate signals can be provided directly to the VCO. Also, a separate timer can be used in lieu of reference oscillator 21 and counter 23 to produce multiplexing signal S. Any desired number of simultaneous transmission channels can be provided. In addition, any desired number of voltage controlled oscillators can be utilized in the present invention; each VCO output need only be provided to multiplexer 19 for multiplexing to the frequency correction circuitry, and to summer 41 to provide any number of transmission channels. For such a configuration, the waveform of select signal S should be modified appropriately to accommodate additional VCOs, and additional registers providing different divisors for counter 25 may be required. Divisor values other than those given above and shown in FIG. 3 as waveforms $n_{11}$ through $n_0$ can be utilized. Voltages $V_{cc}$ and $V_{ss}$ can have values other than those disclosed above. Frequencies for signals E, F, G, H and J other than those disclosed above can be utilized in the present invention. Registers 27 and 29 can for example each be programmable registers or counters, so that the system of FIG. 1 can then be off-line programmable via the registers. Furthermore, loop filters can be utilized in the invention in place of ramp/hold devices and bias resistors. Each loop filter should have a sufficiently long time constant, preferably greater than the reciprocal of the multiplexing rate, to permit "holding" of output signal levels after falloff of the input signal(s) from which they were derived, until a new input signal arrives. The stability of any system output channel frequency would therefore be a function of the loop filter time constant and the selection rate. The loop filters should be identical low-pass filters which integrate and amplify the phase comparator 33 pulses to produce the necessary direct current control voltage for each voltage controlled oscillator. By letting $f_c$ (−3 db point) of the loop filter be much less than the sampling rate set by signal S, the loop filter can maintain the control voltage (or correction voltage or tuning voltage) it provides to a VCO while that loop filter is not selected by signal S and demultiplexer 35 to receive signal K. The amount of allowable short term RF center frequency drift determines the duration for which this voltage should be maintained. For the values given above, $f_c$ could be on the order of 200 Hz. Modulation data rates of signals A and B should be at least ten times the selection rate of signal S so that there is no significant interference between them, and so the loop filter ignores the effect of the modulation and maintains an average center frequency. Any type of signal can be utilized as modulation signals A and B. If, for example, modulation signals A and B are digital, their information can be transmitted on respective FM signals E and F by frequency shift keying wherein a binary "high" or "1" level value is indicated by one predetermined frequency and a "low" or "0" binary level signal value is indicated by a different, for example lower, predetermined frequency, on signal E or signal F, as appropriate. Alternatively, signals A and B can be analog signals. The present invention can be utilized as a signal generator producing frequency modulated (FM) signals, amplitude modulated (AM) signals, signals otherwise modulated or unmodulated signals of controlled respective frequencies.

Signals $n_{11}$, $n_{10}$, $n_9$, $n_8$, $n_7$, $n_6$, $n_5$, $n_4$, $n_3$, $n_2$, $n_1$ and $n_0$ shown in FIG. 3 show the variation with time of the respective values of the twelve least significant bits of the divisor of counter 25. These twelve bits are provided by multiplexer 31 which multiplexes value $n_a$ from register 27 (shown in FIG. 3 between 256 and 512 microseconds) and value $n_b$ from register 29 such as is shown in FIG. 3 between 0 and 256 microseconds.

Some of the many advantages of the invention should now be readily apparent. For example, a novel simultaneous multichannel signal generator has been provided which is capable of multiplexing a plurality of voltage controlled oscillators through a common frequency correction loop to realize simultaneous multiple signal production at a plurality of frequencies. Such multiplexing saves parts, which is especially important for low-cost expendable applications. As a transmitter, the present invention is capable of producing a multicarrier output with individual modulation unique to each carrier, enabling parallel data transfer and a resultant higher flexibility in digital data transmission. The ability to transmit parallel data on multiple carriers reduces the required data transmission rate for the transmitter. If the information in the system would normally be transferred at X bits per second, it could be transmitted over P channels, each at a lower X/P data rate. The lower data rate would allow lower bandwidth transmitter components and lower (by 1/P) necessary remote receiver bandwidth. The number of radio frequency channels used can be increased until the X/P data rate is within the receiver's bandwidth, so that a wider range of receivers including those with relatively low bandwidth can be utilized to receive information. Where the device providing information to the transmitter can produce several different functions, the usability of which may vary with the environment it encounters, the present transmitter enables all of these functions to be transmitted, allowing an operator located at a remote receiver to choose the best function, rather than presetting the signal generator or sending a command thereto. By modulating multiple channels with the same data, a more reliable and possibly longer-range data link can be established through correlation analysis of the channel signals after demodulation. Through differential modulation, the detection capability of the remote receiver can be enhanced to enable longer range indications. Furthermore, a simultaneous multichannel signal generator requires fewer components and therefore less space than would a plurality of conventional signal generators. The multichannel-multicarrier system requires minimal additional signal generating circuitry to effect each additional channel. Only one RF amplifier and one frequency correction network are needed to accommodate a plurality of channels. Each additional channel requires only another VCO and an associated ramp-/hold device, loop filter or control amplifier.

Obviously, many modifications and variations of the present invention are possible in light of the above teachings. It is therefore to be understood that within the scope of the appended claims, the invention may be practiced otherwise than as specifically described.

What is claimed is:

1. A system for continuously producing a plurality of frequency modulated signals, comprising:

a plurality of first summing means adapted to receive respective ones of external modulation signals and connected to receive respective ones of continuous tuning signals for producing control signals, each having a voltage indicative of the sum of said respective modulation and continuous signals;

a plurality of voltage-controlled oscillator means responsive to respective ones of said control signals for producing the modulated signals;

tuning means having first multiplexing means connected to receive said modulated signals for passing one of the modulated signals during any one time in sequence, correction means connected to receive the one modulated signal for producing a correction signal for the one modulated signal proportional to any difference between the frequency of the one modulated signal and a reference signal of constant frequency, demultiplexing means connected to receive the correction signal for providing intermittent tuning signals, each intermittent signal being indicative of any variation of respective ones of said modulated signals from said reference signal of constant frequency, and timing means connected to receive the reference signal for providing a timing signal to said first multiplexing means, to said correction means and to said demultiplexing means to synchronize operation thereof; and hold means connected to receive said intermittent signals and for producing said continuous signals.

* * * * *